US012416074B2

United States Patent
Chen et al.

(10) Patent No.: US 12,416,074 B2
(45) Date of Patent: *Sep. 16, 2025

(54) PVD SYSTEM AND COLLIMATOR

(71) Applicant: Taiwan Semiconductor Manufacturing Company, Ltd., Hsinchu (TW)

(72) Inventors: Kuan-Lin Chen, New Taipei (TW); Tsung-Yi Chou, Changhua County (TW); Wei-Der Sun, Hsinchu (TW); Hao-Wei Kang, Taoyuan County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/617,573

(22) Filed: Mar. 26, 2024

(65) Prior Publication Data
US 2024/0240306 A1 Jul. 18, 2024

Related U.S. Application Data

(63) Continuation of application No. 17/701,610, filed on Mar. 22, 2022, now Pat. No. 11,952,656.
(Continued)

(51) Int. Cl.
*C23C 14/35* (2006.01)
*C23C 14/50* (2006.01)
*H01J 37/34* (2006.01)

(52) U.S. Cl.
CPC ............ *C23C 14/354* (2013.01); *C23C 14/50* (2013.01); *H01J 37/3441* (2013.01); *H01J 37/3447* (2013.01)

(58) Field of Classification Search
CPC ..... C23C 14/354; C23C 14/50; C23C 14/024; C23C 14/345; C23C 14/35; C23C 14/165; H01J 37/3441; H01J 37/3447
(Continued)

(56) References Cited

U.S. PATENT DOCUMENTS 5,650,052 A * 7/1997 Edelstein ............ H01J 37/3447
204/192.12
11,952,656 B2 * 4/2024 Chen ..................... C23C 14/35
(Continued)

FOREIGN PATENT DOCUMENTS

JP 11140638 A 5/1999

OTHER PUBLICATIONS

Platt et al. "Magnetic and Structural Properties of FeCoB Thin Films". IEEE Transactions on Magnetics vol. 37, No. 4 Jul. 2001 (Year: 2001).

*Primary Examiner* — Rodney G McDonald
(74) *Attorney, Agent, or Firm* — KILPATRICK TOWNSEND & STOCKTON LLP

(57) ABSTRACT

A physical vapor deposition (PVD) system includes: a pedestal configured to accommodate a semiconductor wafer; a cover plate above the pedestal configured to hold a target; and a collimator disposed above the pedestal and below the cover plate. The collimator has an upper surface and a lower surface. The lower surface is flat, and the upper surface is non-flat. A first thickness, in a vertical direction, of the collimator at a central portion is smaller than a second thickness, in the vertical direction, of the collimator at a peripheral portion.

20 Claims, 6 Drawing Sheets

Related U.S. Application Data

(60) Provisional application No. 63/235,652, filed on Aug. 20, 2021.

(58) Field of Classification Search
USPC .......................................... 204/298.11, 192.12
See application file for complete search history.

(56) References Cited

U.S. PATENT DOCUMENTS

| | | |
|---|---|---|
| 2017/0253959 A1 | 9/2017 | Wang et al. |
| 2019/0287771 A1* | 9/2019 | Park .................. H01J 37/32651 |
| 2020/0105606 A1 | 4/2020 | Lin et al. |

* cited by examiner

PVD SYSTEM AND COLLIMATOR

CROSS-REFERENCES TO RELATED APPLICATIONS

The present application is a continuation application of U.S. patent application Ser. No. 17/701,610, filed Mar. 22, 2022, which claims priority to U.S. Provisional Patent Application No. 63/235,652, filed on Aug. 20, 2021, and entitled "Physical Vapor Deposition Seed Collimator Optimization," the entire disclosure of which is incorporated herein by reference.

TECHNICAL FIELD

The technology of the application relates to physical vapor deposition (PVD) systems and methods, and more particularly to PVD systems and methods which use collimators.

BACKGROUND

Physical vapor deposition (PVD) is commonly used within the semiconductor industry, as well as within solar, glass coating, and other industries. A PVD system is used, for example, to deposit metal layers onto substrates such as semiconductor wafers that are positioned in a vacuum plasma chamber. A PVD process may be used, for example, to deposit a target material such as titanium or titanium nitride onto the semiconductor wafer. In a typical PVD system, the target materials to be coated are disposed in a vacuum chamber containing an inert gas such as argon. The deposited layers can be used, for example, as diffusion barriers, adhesion or seed layers, primary conductors, anti-reflection coatings, etch stops, etc.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

Figure 1:
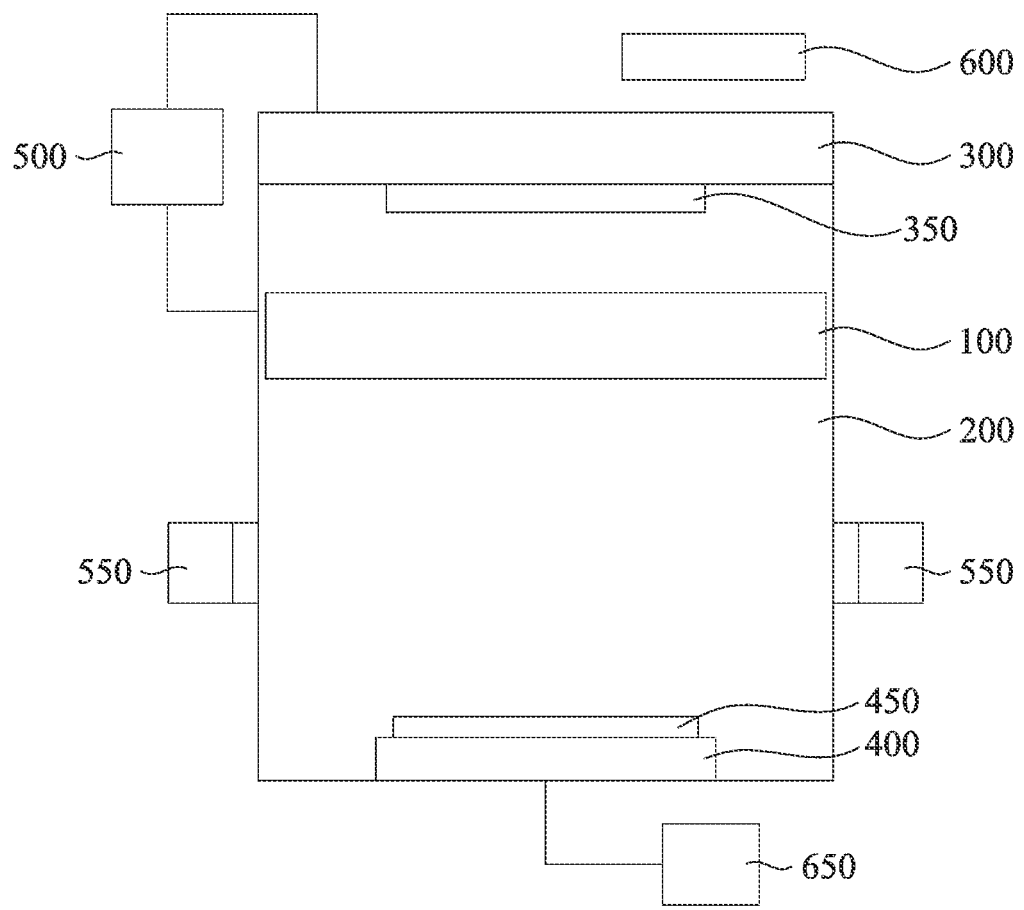
FIG. 1 illustrates a schematic diagram of a physical vapor deposition (PVD) system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Ideally, a source of the material deposited in a PVD system—a target—should be very wide relative to the semiconductor wafers so that the target represents an infinite source plane to the particle-receiving face of the semiconductor wafers. Unfortunately, the target has a finite size that is usually the same order of magnitude as that of the semiconductor wafers. Expelled or sputtered target material tends to leave the target in all directions, to collide with each other and scatter, arriving at the semiconductor wafers from a wide variety of angles. As a result, the deposited layer in the areas of etching topography in the semiconductor wafer is formed unevenly, leaving a relatively thick lateral layer on sidewalls of the topography and a thin layer at the bottom of the etchings.

In order to increase the directionality of expelled or sputtered target material onto a semiconductor wafer, a collimator can be used. The collimator is a structure having a plurality of passages to allow the target material to pass through. As the target material travels toward the semiconductor wafer, the target material whose direction is not substantially perpendicular to the semiconductor wafer impact on the sidewalls of the collimator and adhere thereto. Thus, the collimator allows only the target material which follows a substantially perpendicular path to the semiconductor wafer to pass through. The deposited layer which then forms on the semiconductor wafer is, therefore, of a generally uniform thickness. However, traditional collimators result in greater thickness in central portions of the semiconductor wafer than on peripheral portions of the semiconductor wafer. Therefore, at least to improve deposition layer uniformity, a PVD system and a PVD method using an improved collimator are disclosed herein.

PVD systems having collimators in accordance with the present disclosure deposit layers of target material on the semiconductor wafer having improved thickness uniformity, as compared with PVD systems using traditional collimators. In some embodiments, a 67% or greater improvement in thickness uniformity may be achieved. Accordingly, the disclosed collimators may be particularly advantageous for deposition of copper seed layers in preparation for depositing copper interconnect layers.

For example, in some embodiments, using techniques known to those of skill in the art, a semiconductor wafer is processed to form semiconductor structures including, for example, transistors, resistors, and capacitors. The semiconductor structures are then covered, for example with a dielectric layer to prevent electrical conduction between the semiconductor structures and conductive interconnect layers to be subsequently formed.

In some embodiments, a copper barrier layer is deposited on the dielectric layer. The cover barrier layer is configured to prevent copper from diffusing or otherwise migrating into the dielectric layer. The copper barrier layer may comprise a barrier layer comprising Ta, TaN, or Ta and TaN. In some embodiments, the conductive interconnect layers are used to form electrical connections between circuit components, such as transistors, capacitors, and resistors. In some embodiments, the transistors include FinFET transistors, as understood by those of skill in the art. In some embodiments, the transistors include gate all around (GAA) transistors, as understood by those of skill in the art. In some embodiments, the transistors have barrier or capping features, for example, comprising one or more of Ti, TiN, Ta, TaN, Co, AlO, and another material.

A copper seed layer may be deposited on the copper barrier layer to help the growth of a copper interconnect layer to be subsequently formed on the copper seed layer. The copper seed layer may be formed using systems and methods discussed herein having embodiments of collimators having features discussed herein. Other layers may alternatively be formed using systems and methods discussed herein having embodiments of collimators having features discussed herein. For example, layers of other materials may be formed using systems and methods discussed herein having embodiments of collimators having features discussed herein.

After a copper seed layer is deposited, a copper interconnect layer may be deposited on the copper seed layer using, for example, electroplating and etching processes. After the copper interconnect layer is deposited, a chemical mechanical polishing (CMP) process may be used to remove excess copper.

To form multiple interconnect layers, these steps may be repeated for each additional layer.

FIG. 1 is a schematic diagram of a physical vapor deposition (PVD) system in accordance with some embodiments. The physical vapor deposition system includes a collimator 100, a chamber 200, a cover plate 300, and a pedestal 400. The cover plate 300 is disposed on the chamber 200 for holding a target 350. The pedestal 400 is disposed in the chamber 200 for supporting a semiconductor wafer 450. The collimator 100 is mounted between the cover plate 300 and the pedestal 400. For example, the collimator 100 can be mounted on the walls of the chamber 200 through a plurality of fixing elements, such as screws (not shown).

Figure 2:
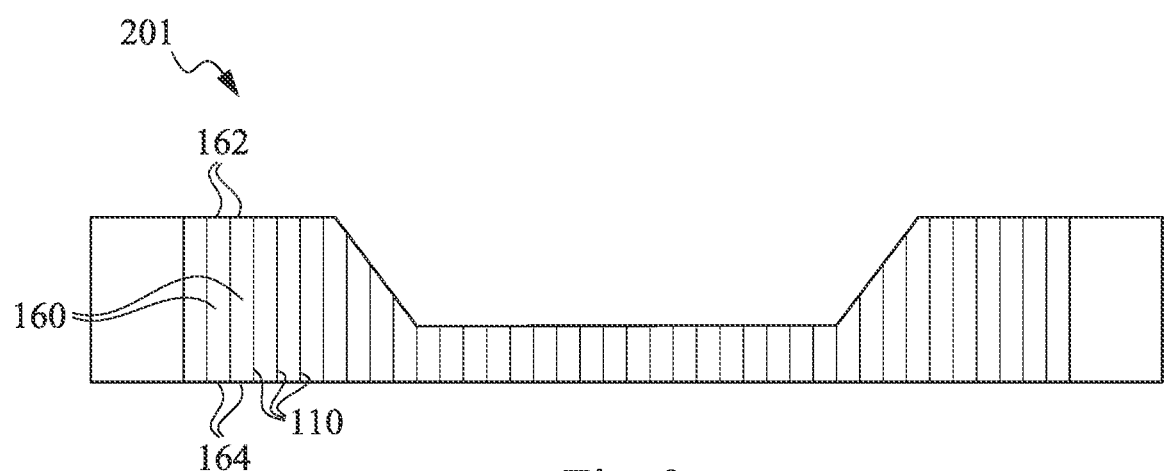
FIG. 2 is a schematic diagram of a collimator of FIG. 1 in accordance with some embodiments.

FIG. 2 is a cross-sectional schematic diagram of an embodiment 200 of the collimator 100 of FIG. 1 in accordance with some embodiments. The collimator 201 includes a plurality of sidewall sheets 110 together forming a plurality of passages 160. Each passage 160 has an entrance 162 and an exit 164 opposite to the entrance 162. Reference is made to FIG. 1. The entrances 162 of the passages 160 face the cover plate 300 and the exits 164 of the passages 160 face the pedestal 400. In this embodiment, the passages 160 each have a same width dimension between adjacent sidewall sheets, as viewed in FIG. 2.

At least a portion of collimator 201 has a cross sectional shape defined by a rectangle from which a trapezoid has been subtracted to form a cutout. Accordingly, at least a portion of the three dimensional collimator 201 has a shape defined by a cylinder from which a conical frustum has been subtracted to form the cutout.

Therefore, some sidewalls 110 have a first sidewall length from an entrance 162 of a corresponding passage 160 to an exit 164 of the corresponding passage 160, and some other sidewalls 110 have a second sidewall length from an entrance 162 of a corresponding passage 160 to an exit 164 of the corresponding passage 160, where the first and second sidewall lengths are different. In some embodiments, a ratio of the first sidewall length to the second sidewall length is about ⅔, about 0.1, about 0.2, about 0.3, about 0.4, about 0.5, about 0.6, about 0.7, about 0.8, or about 0.9. In some embodiments, the ratio of the first sidewall length to the second sidewall length is less than about ⅔, about 0.1, about 0.2, about 0.3, about 0.4, about 0.5, about 0.6, about 0.7, about 0.8, or about 0.9.

Also, some passages 160 have a first passage length from their entrance 162 to their exit 164, and some other passages 160 have a second passage length from their entrance 162 to their exit 164, where the first passage length is different from the second passage length. In some embodiments, a ratio of the first passage length to the second passage length is about ⅔, about 0.1, about 0.2, about 0.3, about 0.4, about 0.5, about 0.6, about 0.7, about 0.8, or about 0.9. In some embodiments, the ratio of the first passage length to the second passage length is less than about ⅔, about 0.1, about 0.2, about 0.3, about 0.4, about 0.5, about 0.6, about 0.7, about 0.8, or about 0.9.

Reference is made to FIGS. 1 and 2. The function of the collimator 100 is to allow only target material which follows paths that are relatively perpendicular to the semiconductor wafer 450 to pass through to the semiconductor wafer 450, and to intercept or filter target material whose direction is not relatively perpendicular to the semiconductor wafer 450. This improves uniformity of the target material formed on the semiconductor wafer surfaces. The expelled or sputtered target material enters the collimator 100 from the entrances 162 of the passages 160 and leave from the exits 164. During the physical vapor deposition operation, the target material travelling at relatively large angles with respect to a line perpendicular to the upper surface of the semiconductor wafer 450 impacts the sidewall sheets 110 of the collimator 100, and is prevented from being deposited on the semiconductor wafer 450.

Each passage 160 passes target material received at its entrance 162 to the semiconductor wafer 450 at a rate and a maximum angle depending on a its width dimension and a length dimension between its entrance and its exit. At least because of geometric reasons, collimators which have uniform width and length dimensions deposit more target material in the central portion of the semiconductor wafer 450. For example, in some embodiments, each point on the semiconductor wafer 450 receives target material which has passed through a zenith passage 160 directly above it, and receives target material which has passed through passages 160 which are less than a distance from the zenith passage 160. Therefore, points on the semiconductor wafer 450 which are central receive target material from a larger number of passages than points on the semiconductor wafer 450 which are peripheral.

In contrast, in PVD systems using collimator 201, the amount of target material received by peripheral points on semiconductor wafer 450 is increased with respect to the amount of target material received by central points on semiconductor wafer 450, as compared with PVD systems using collimators having uniform passage width and length dimensions. For example, a point on the periphery of semiconductor wafer 450 receives target material from corresponding longer length peripheral passages 160 of collimator 201, and receives target material from shorter length more central passages 160 of collimator 201. However, a point in the center of semiconductor wafer 450 receives target material from corresponding shorter length central passages 160 of collimator 201, but does not receive target material from longer length peripheral passages 160 of collimator 201.

Figure 3:
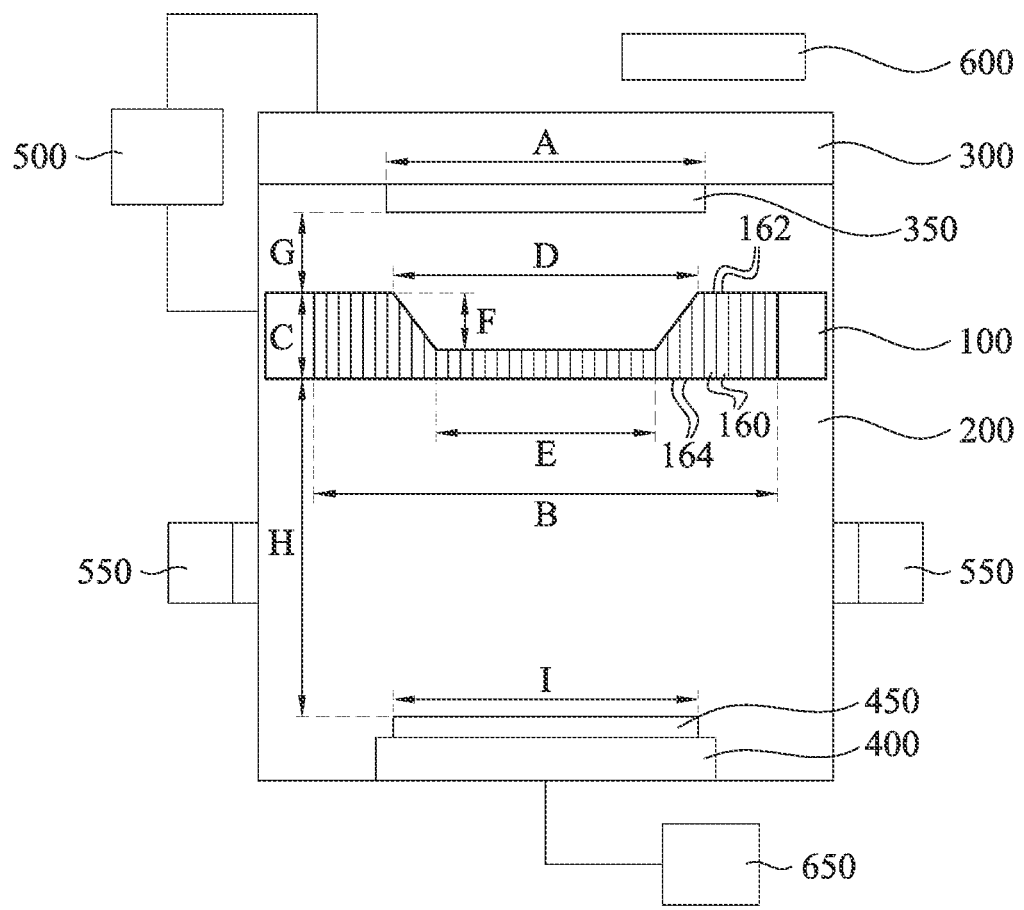
FIG. 3 illustrates a schematic diagram of a physical vapor deposition (PVD) system in accordance with some embodiments.

FIG. 3 illustrates a schematic diagram of a physical vapor deposition (PVD) system in accordance with some embodiments. Dimensions A-I are indicated.

Dimension A represents a width dimension of target 350. In some embodiments, dimension A may be equal to about 380 mm, about 390 mm, about 400 mm, about 410 mm, about 420 mm, about 430 mm, about 440 mm, about 450 mm, about 460 mm, about 470 mm, or about 480 mm. Other values may be used.

Dimension B represents a width dimension of collimator 201. In some embodiments, dimension B may be equal to about 400 mm, about 410 mm, about 420 mm, about 430 mm, about 440 mm, about 450 mm, about 460 mm, about 470 mm, about 480 mm, about 490 mm, or about 500 mm. Other values may be used.

Dimension C represents a thickness dimension of collimator 201. In some embodiments, dimension C may be equal to about 100 mm, about 110 mm, about 120 mm, about 130 mm, about 140 mm, about 150 mm, about 160 mm, about 170 mm, about 180 mm, about 190 mm, or about 200 mm. Other values may be used. In some embodiments, dimension C is equal to about 152.4 mm.

Dimension D represents a maximum width dimension of the trapezoid/frustum cutout of collimator 201. In some embodiments, dimension D may be equal to about 170 mm, about 180 mm, about 190 mm, about 200 mm, about 210 mm, about 220 mm, about 230 mm, about 240 mm, about 250 mm, about 260 mm, or about 270 mm. Other values may be used. In some embodiments, dimension D is equal to about 223 mm.

Dimension E represents a minimum width dimension of the trapezoid/frustum cutout of collimator 201. In some embodiments, dimension D may be equal to about 10 mm, 15 mm, 20 mm, 30 mm, 35 mm, 40 mm, 45 mm, or about 50 mm. Other values may be used. In some embodiments, dimension E is equal to about 31.7 mm.

Dimension F represents a thickness dimension of the trapezoid/frustum cutout of collimator 201. In some embodiments, dimension F may be equal to about 25 mm, about 30 mm, about 35 mm, about 40 mm, about 45 mm, about 50 mm, about 55 mm, about 60 mm, about 65 mm, about 70 mm, or about 75 mm. Other values may be used. In some embodiments, dimension F is equal to about 50.8 mm.

Dimension G represents a vertical or perpendicular distance between target 350 and collimator 201. In some embodiments, dimension G may be equal to about 40 mm, about 45 mm, about 50 mm, about 55 mm, about 60 mm, about 65 mm, about 70 mm, about 75 mm, about 80 mm, about 85 mm, about 90 mm, about 95 mm, about 100 mm, about 105 mm, about 110 mm, about 115 mm, about 120, about 125 mm, or about 130 mm. Other values may be used. In some embodiments, dimension G is equal to about 86.4 mm.

Dimension H represents a vertical or perpendicular distance between collimator 201 and wafer 450. In some embodiments, dimension H may be equal to about 300 mm, about 310 mm, about 320 mm, about 330 mm, about 340 mm, about 350 mm, about 360 mm, about 370 mm, about 380 mm, about 390 mm, about 400 mm, about 410 mm, or about 420 mm. Other values may be used.

Dimension I represents a width dimension of semiconductor wafer 450. In some embodiments, dimension I may be equal to about 260 mm, about 270 mm, about 280 mm, about 290 mm, about 300 mm, about 310 mm, about 320 mm, about 330 mm, about 340 mm, or about 350 mm. Other values may be used.

In some embodiments, at least so that the implanted material has desired deposition thickness uniformity, the values of dimensions D, E, and F, which define the trapezoid/frustum cutout, are individually and/or collectively based on one or more of dimensions A-C and G-I.

For example, in some embodiments, the PVD system is characterized by a ratio (F/C)/(G/H), where F/C is equal to one of the values listed above for dimension F divided by one of the values listed above for dimension C, and where G/H is equal to one of the values listed above for dimension G divided by one of the values listed above for dimension H. For example, in some embodiments, dimension F is about equal to 50.8 mm, dimension C is equal to about 152.4 mm, dimension G is equal to about 86.4 mm, and dimension H is equal to about 360 mm. Accordingly, in some embodiments, the ratio (F/C)/(G/H) is equal to about 0.33/about 0.24 or about 1.4.

In some embodiments, the PVD system is characterized by a ratio (A/B)/(G/H), where A/B is equal to one of the values listed above for dimension A divided by one of the values listed above for dimension B, and where G/H is equal to one of the values listed above for dimension G divided by one of the values listed above for dimension H. For example, in some embodiments, dimension A is about equal to 430 mm, dimension B is equal to about 450 mm, dimension G is equal to about 86.4 mm, and dimension H is equal to about 360 mm. Accordingly, in some embodiments, the ratio (A/B)/(G/H) is equal to about 0.96/about 0.24 or about 4.0.

Figure 4:
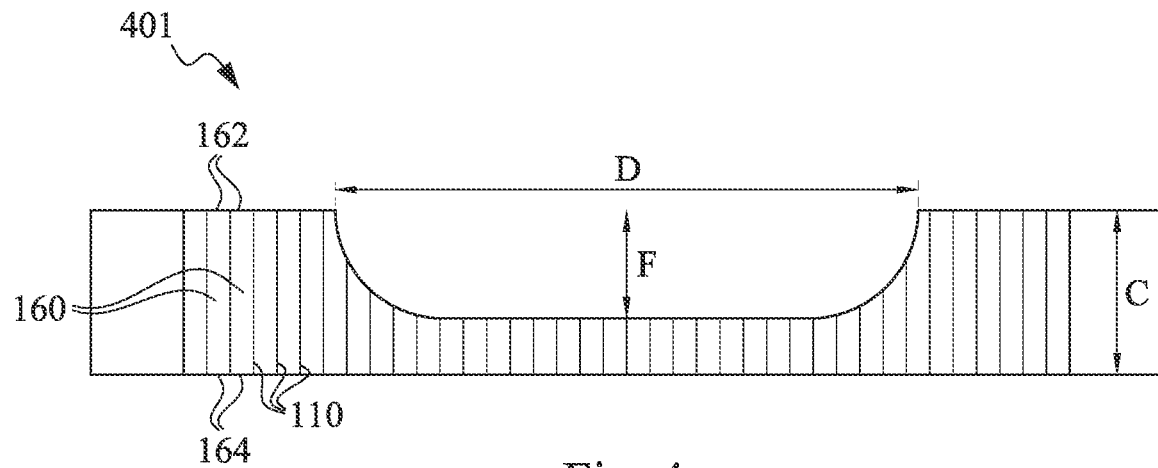
FIG. 4 is a schematic diagram of a collimator of FIG. 1 in accordance with some embodiments.

FIG. 4 is a cross-sectional schematic diagram of an embodiment 401 of the collimator 100 of FIG. 1 in accordance with some embodiments. The collimator 401 has features similar to collimator 201 of FIG. 2, and includes a plurality of sidewall sheets 110 together forming a plurality of passages 160. Each passage 160 has an entrance 162 and an exit 164 opposite to the entrance 162. Reference is made to FIG. 1. The entrances 162 of the passages 160 face the cover plate 300 and the exits 164 of the passages 160 face the pedestal 400. In this embodiment, the passages 160 each have a same width dimension between adjacent sidewall sheets, as viewed in FIG. 4.

At least a portion of collimator 401 has a cross sectional shape defined by a rectangle from which a portion of a smaller rectangle having rounded corners has been subtracted to form a cutout. Accordingly, at least a portion of the three dimensional collimator 401 has a shape defined by a cylinder from which a smaller cylinder having a rounded edge has been subtracted to form the cutout. In the illustrated embodiment, the rounded corner and edge are rounded with a radius equal to the thickness dimension of the smaller rectangle or smaller cylinder corresponding with the thickness dimension F. Other rounding parameters may be used in some embodiments.

At least for reasons discussed above with reference to collimator 201, in PVD systems using collimator 401, the amount of target material received by peripheral points on semiconductor wafer 450 is increased with respect to the amount of target material received by central points on semiconductor wafer 450, as compared with PVD systems using collimators having uniform passage width and length dimensions. Accordingly, at least for reasons discussed above with reference to collimator 201, PVD systems using collimator 401 provide improved thickness uniformity of target material deposited on semiconductor wafer 450, as compared with PVD systems using collimators having uniform passage width and length dimensions.

In some embodiments, one or more of the values of a maximum width dimension of the smaller cylinder cutout of collimator 401, a rounded edge radius of the smaller cylinder cutout of collimator 401, and a thickness dimension of the smaller cylinder cutout of collimator 401 are individually and/or collectively based on one or more of dimensions A-C and G-I, illustrated in FIG. 3.

Figure 5:
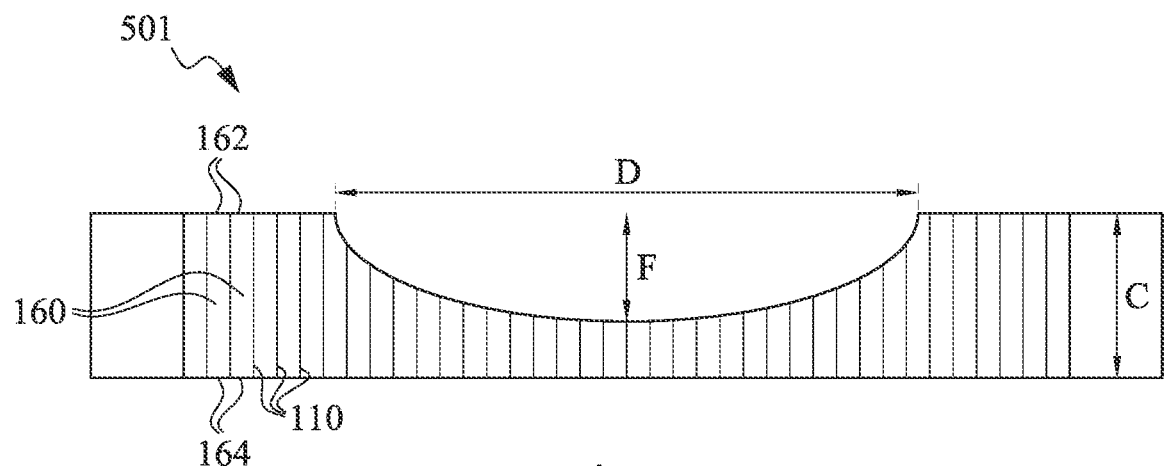
FIG. 5 is a schematic diagram of a collimator of FIG. 1 in accordance with some embodiments.

FIG. 5 is a cross-sectional schematic diagram of an embodiment 501 of the collimator 100 of FIG. 1 in accordance with some embodiments. The collimator 501 has features similar to collimator 201 of FIG. 2 and collimator 401 of FIG. 4, and includes a plurality of sidewall sheets 110 together forming a plurality of passages 160. Each passage 160 has an entrance 162 and an exit 164 opposite to the entrance 162. Reference is made to FIG. 1. The entrances 162 of the passages 160 face the cover plate 300 and the exits 164 of the passages 160 face the pedestal 400. In this embodiment, the passages 160 each have a same width dimension between adjacent sidewall sheets, as viewed in FIG. 5.

At least a portion of collimator 501 has a cross sectional shape defined by a rectangle from which a portion of an ellipse has been subtracted to form a cutout. Accordingly, at least a portion of the three dimensional collimator 501 has a shape defined by a cylinder from which an ellipsoid has been subtracted to form the cutout. In the illustrated embodiment, the ellipse and ellipsoid have a defining dimension which is equal to the thickness dimension of the ellipse or ellipsoid corresponding with the thickness dimension F. Other rounding parameters may be used in some embodiments.

At least for reasons discussed above with reference to collimators 201 and 401, in PVD systems using collimator 501, the amount of target material received by peripheral points on semiconductor wafer 450 is increased with respect to the amount of target material received by central points on semiconductor wafer 450, as compared with PVD systems using collimators having uniform passage width and length dimensions. Accordingly, at least for reasons discussed above with reference to collimator 201, PVD systems using collimator 501 provide improved thickness uniformity of target material deposited on semiconductor wafer 450, as compared with PVD systems using collimators having uniform passage width and length dimensions.

In some embodiments, one or more of the values of the defining dimensions of the ellipse or ellipsoid cutout of collimator 501 are individually and/or collectively based on one or more of dimensions A-C and G-I, illustrated in FIG. 3.

Figure 6:
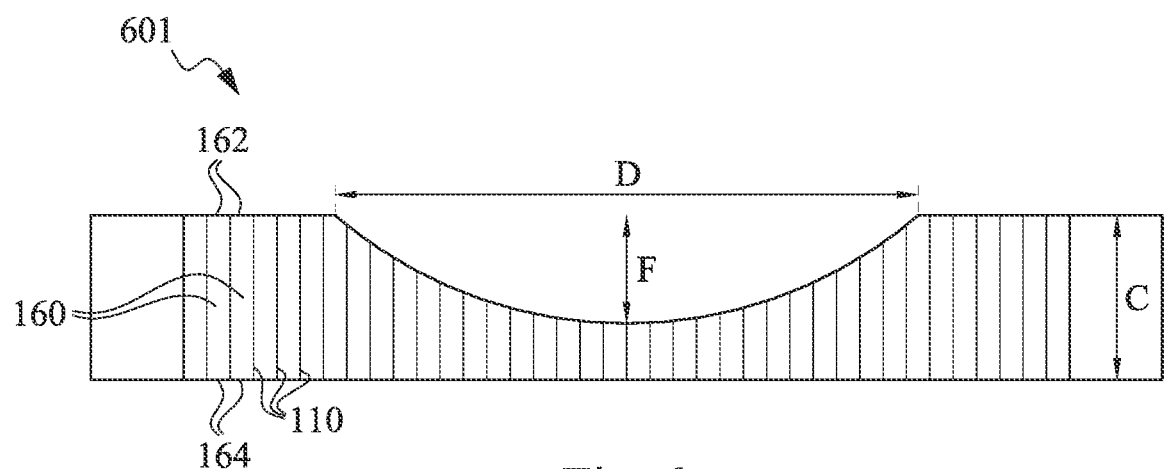
FIG. 6 is a schematic diagram of a collimator of FIG. 1 in accordance with some embodiments.

FIG. 6 is a cross-sectional schematic diagram of an embodiment 601 of the collimator 100 of FIG. 1 in accordance with some embodiments. The collimator 601 has features similar to collimator 201 of FIG. 2, collimator 401 of FIG. 4, and collimator 501 of FIG. 5. Collimator 601 includes a plurality of sidewall sheets 110 together forming a plurality of passages 160. Each passage 160 has an entrance 162 and an exit 164 opposite to the entrance 162. Reference is made to FIG. 1. The entrances 162 of the passages 160 face the cover plate 300 and the exits 164 of the passages 160 face the pedestal 400. In this embodiment, the passages 160 each have a same width dimension between adjacent sidewall sheets, as viewed in FIG. 6.

At least a portion of collimator 601 has a cross sectional shape defined by a rectangle from which a portion of a circle has been subtracted to form a cutout. Accordingly, at least a portion of the three dimensional collimator 601 has a shape defined by a cylinder from which a sphere has been subtracted to form the cutout. In the illustrated embodiment, the circle and sphere have a radius which is greater than the thickness dimension of the cutout corresponding with the thickness dimension F. Other radii values may be used in some embodiments.

At least for reasons discussed above with reference to collimators 201, 401 and 501, in PVD systems using collimator 601, the amount of target material received by peripheral points on semiconductor wafer 450 is increased with respect to the amount of target material received by central points on semiconductor wafer 450, as compared with PVD systems using collimators having uniform passage width and length dimensions. Accordingly, at least for reasons discussed above with reference to collimator 201, PVD systems using collimator 601 provide improved thickness uniformity of target material deposited on semiconductor wafer 450, as compared with PVD systems using collimators having uniform passage width and length dimensions.

In some embodiments, one or more of the values of the circle or sphere radius, and its distance from an upper surface of the collimator 601 are individually and/or collectively based on one or more of dimensions A-C and G-I, illustrated in FIG. 3.

In some embodiments, cutouts having other geometries are used. In some embodiments, one or more defining values of the other geometries are individually and/or collectively based on one or more of dimensions A-C and G-I, illustrated in FIG. 3.

Reference is made again to FIG. 1. In FIG. 1, the collimator 100 is closer to the cover plate 300 than the pedestal 400. For example, the collimator 100 can be disposed in the upper half portion of the chamber 200. This configuration prevents the target material filtered by the collimator 100 from forming a patterned layer on the semiconductor wafer 450 due to the pattern of passages 160 (for example, a honeycomb pattern formed by hexagonal passages 160) of the collimator 100.

In some embodiments, the physical vapor deposition system further includes a direct current (DC) power supply 500 electrically connected to the cover plate 300. The direct current power supply 500 establishes a voltage potential between the chamber 200 and the target 350 mounted onto the cover plate 300. The negative terminal of the direct current power supply 500 may for example, be connected to the cover plate 300 and the positive terminal may for example, be connected to the chamber 200, which may for example, be grounded. Accordingly, a negative bias may be applied to the cover plate 300 while holding the chamber 200 at ground potential. As a result, an electric field is generated in the chamber 200. In alternative embodiments, a positive bias may be applied to cover plate 300 while holding the chamber at the ground potential.

Plasma may be generated in the physical vapor deposition system, for example, by introducing a plasma feed gas, such as argon, into the chamber 200. Electrons, for example, of the plasma feed gas collide with atoms of the plasma feed gas to create positive ions. The negative bias applied by the direct current power supply 500 attracts the positive ions towards the target 350. The positive ions collide with the target 350 with high energy. In other words, the negative bias on the cover plate 300 accelerates positive ions of the formed plasma towards the target 350 to dislodge atoms from the target 350. The dislodged atoms are freed from the surface of the target 350, for example, by direct momentum transfer. The dislodged atoms may or may not become ionized, and a subset of them subsequently travel through the collimator 100 and onto the semiconductor wafer 450, as discussed above. In some embodiments, the target 350 can be made of aluminum, tantalum, titanium, copper or other suitable target material.

In some embodiments, the physical vapor deposition system further includes a magnetic field generator 550 disposed around the chamber 200 in a region, for example, just above the pedestal 400. The magnetic field generator 550 generates magnetic fields in the chamber 200. The magnetic fields increase a residence time of the electrons by causing the electrons to spiral through the plasma. By varying the shape of the magnetic fields of the magnetic field generator 550, the plasma can be directionally controlled. Therefore, ionization levels of the plasma feed gas also increase. In some embodiments, the magnetic field generator 550 may include coaxial electromagnetic coils (including solenoids), as well as appropriate arrangements of permanent magnets, and combinations of electromagnetic coils and permanent magnets, as will be understood by one of skill in the art. A DC and/or a radio frequency (RF) bias can be applied to the magnetic field generator 550 to generate the magnetic fields. Plasma uniformity, particularly uniformity of the plasma near the semiconductor wafer 450, may be controlled by the magnetic field generator 550 receiving the RF and/or DC bias. Moreover, because the semiconductor wafer 450 is usually a circular semiconductor wafer, concentric electromagnetic coils may be preferably written used.

In some embodiments, in order to control the density and distribution of the deposited layer, magnetic fields around the target 350 can be manipulated. Therefore, the physical vapor deposition system can further include a magnet 600 disposed above the cover plate 300. When the physical vapor deposition system is operating, the magnetic fields generated by the magnet 600 forces arcing to occur at intersections of the magnetic fields and the surface of the target 350, thereby influencing a vaporized coating. The magnet 600 can be suspended above the cover plate 350. Shifting the position of the magnet 600 provides for positioning of the arcing for controlling vapor deposition. While the magnet 600 is described herein as a single magnet, it is understood that a magnet assembly, formed by a combination of permanent magnets and electromagnets, could also be used with minimal modification to the disclosure.

In some embodiments, the pedestal 400 can be an electrostatic chuck (ESC) configured to electrostatically hold the semiconductor wafer 450 in place. Although electrostatic chucks vary in design, they are generally based on the principal of applying a voltage to one or more electrodes in the chuck so as to induce opposite polarity bias in the semiconductor wafer 450 and electrodes. The electrostatic attractive force between the opposite charges presses the semiconductor wafer 450 against the chuck, thereby securely retaining the semiconductor wafer 450. Moreover, an additional function of the pedestal 400 may include semiconductor wafer temperature control during deposition and sputtering.

In some embodiments, the physical vapor deposition system can further include a RF bias supply 650 electrically connected to the pedestal 400. An RF frequency signal is applied by the RF bias supply 650 for coupling energy to kinetic electrons to excite the plasma ions near the semiconductor wafer 450. Typically, the frequency of the RF bias signal is a very high frequency (VHF) because of the low mass-to-charge ratio of electrons. The ions of the VHF-coupled plasma formed near the semiconductor wafer 450 are employed in a re-sputtering step. However, in other embodiments, the pedestal 400 may be grounded or left electrically floating.

Figure 7:
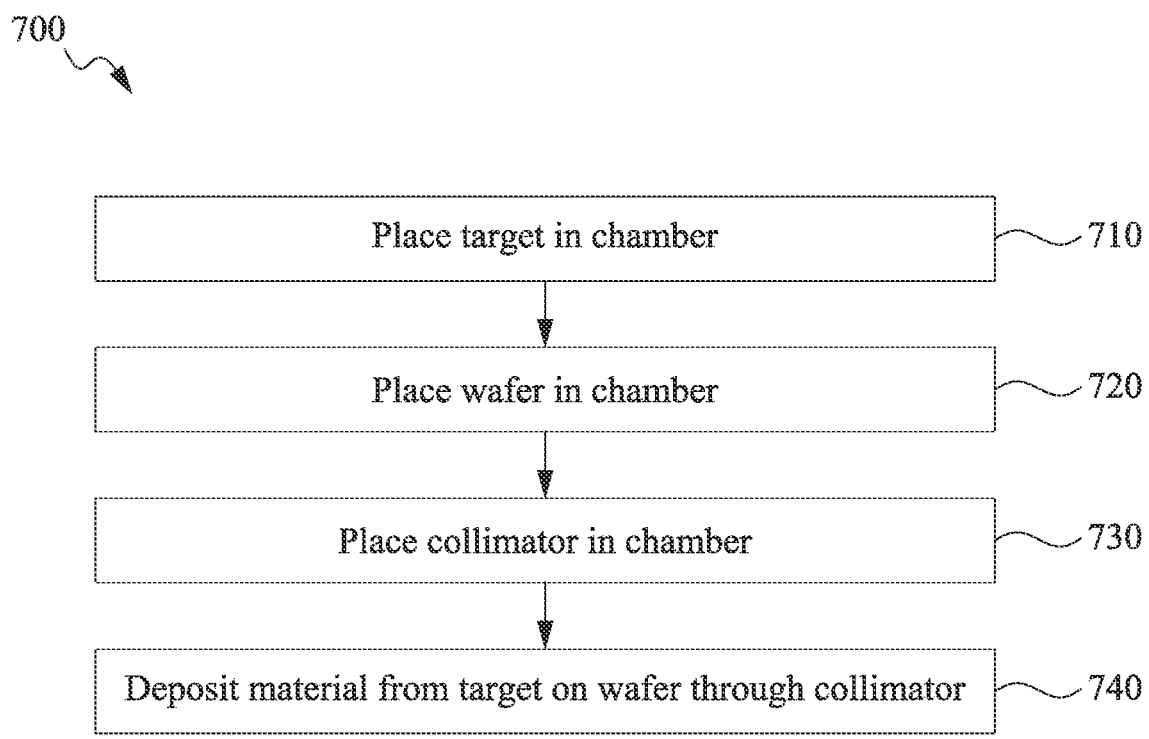
FIG. 7 is a flowchart of a method of depositing a material on a semiconductor wafer with a PVD process in accordance with some embodiments.

FIG. 7 is a flowchart illustration of a physical vapor deposition method 700 of depositing a layer of a target material on a semiconductor wafer in accordance with some embodiments. The method can be applied to, but should not be limited to, the physical vapor deposition system of FIG. 1. Reference is made both to FIGS. 1 and 7. As shown in operation 710, the target 350 is disposed on the cover plate 300 which is disposed in the chamber 200 of the physical vapor deposition system. In some embodiments, the target 350 can be made of aluminum, tantalum, titanium, copper or other suitable target material.

As shown in operation 720, the semiconductor wafer 450 is disposed on the pedestal 400 in the chamber 200. In some embodiments, the pedestal 400 can be an electrostatic chuck (ESC) configured to electrostatically hold the semiconductor wafer 450 in place.

As shown in operation 730, the collimator 100 is mounted and oriented in the chamber 200. Reference is made to FIGS. 1 and 3. In greater detail, the collimator 100 can be mounted on the walls of the chamber 200 by a plurality of fixing elements such as screws. In some embodiments, the collimator 100 is oriented such that the cutout side of collimator 100 faces the target 350 and the cover plate 300. In some embodiments, the collimator 100 is oriented such that the cutout side of collimator 100 faces the semiconductor wafer 450 and the pedestal 400.

Reference is made again to FIGS. 1 and 7. As shown in operation 740, material is dislodged from the target 350, such that the material is deposited on the semiconductor wafer 450 after being filtered by the collimator 100. The function of the collimator 100 is to allow only atoms which follow paths that are relatively perpendicular to the semiconductor wafer 450 to pass through and to block atoms that are not relatively perpendicular to the semiconductor wafer 450. Because the passages 160 of the central portion of the collimator 100 are shorter than the passages 160 of the peripheral portions of the collimator 100, the layer of target material deposited on the semiconductor wafer 450 has improved thickness uniformity, as compared with PVD systems using collimators having uniform passage width and length dimensions.

Figure 8:
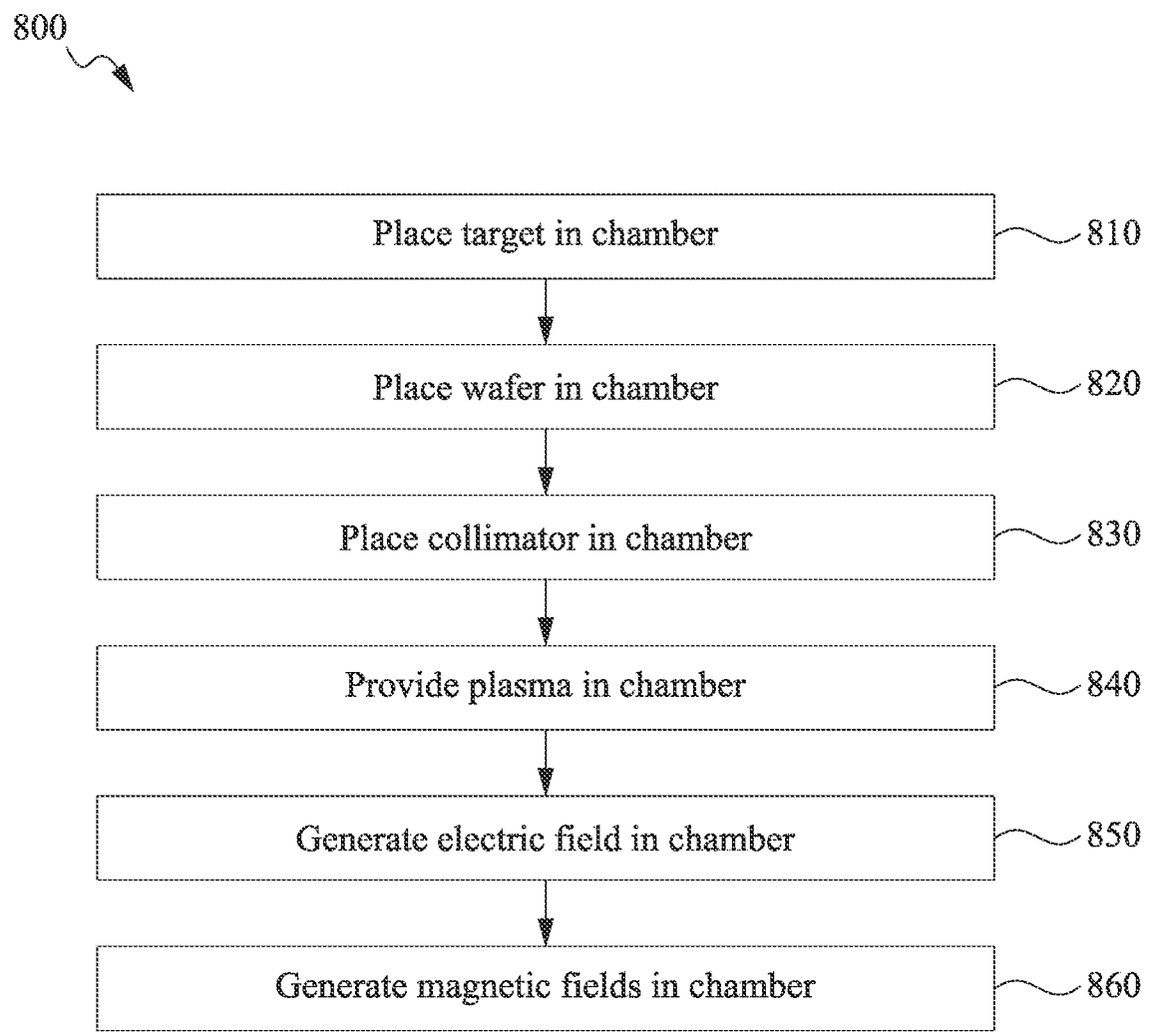
FIG. 8 is a flowchart of a method of depositing a material on a semiconductor wafer with a PVD process in accordance with some embodiments.

FIG. 8 is a flowchart illustration of a physical vapor deposition method 800 of depositing a layer of a target material on a semiconductor wafer in accordance with some embodiments. The method can be applied to, but should not be limited to, the physical vapor deposition system of FIG. 1.

Since the details of operations 810, 820, and 830 are respectively similar to operations 710, 720, and 730 of method 700, descriptions of operations 810, 820, and 830 are not be repeated.

In some embodiments, to dislodge atoms from the target 350, a plasma feed gas, such as argon, can be provided in the chamber 200, as shown in operation 840. Subsequently, an electric field is generated in the chamber 200 for controlling the momentum of the plasma feed gas, as shown in operation 850. For example, the DC power supply 500 in FIG. 1 can be electrically connected to the cover plate 300 to provide the electric field across the plasma feed gas in the chamber 200. Therefore, electrons collide with atoms of the plasma feed gas to create ions. The negative bias applied by the direct current power supply 500 attracts the ions towards the target 350 to sputter atoms from the target 350.

In some embodiments, as shown in operation 860, a magnetic field is generated in the chamber 200. For example, the magnetic field generator 550 can be disposed around the chamber 200 for generating magnetic fields in the chamber 200. The magnetic fields are used to increase a residence time of the electrons by causing the electrons to spiral through the plasma. Hence, ionization levels of the plasma feed gas also increase.

In some embodiments, the magnetic field distribution in the chamber 200 can be controlled. For example, the magnet 600 of FIG. 1 can be disposed above the cover plate 300. Shifting the position of the magnet 600, the magnetic field distribution is changed, thereby controlling vapor deposition.

In some embodiments, the portion of the plasma near the semiconductor wafer 450 can be manipulated. For example, the RF bias supply 650 can be electrically connected to the pedestal 400 for coupling energy to kinetic electrons to excite the plasma ions near the semiconductor wafer 450.

The collimator allows only atoms which follow paths that are relatively perpendicular to the semiconductor wafer to pass through and intercepts atoms that are not relatively perpendicular to the semiconductor wafer. This ensures that an even layer of target material is formed on the semiconductor wafer surfaces. The expelled or sputtered target atoms enter the collimator from the entrances of the passages and leave from the exits. Because the passages of the central portion of the collimator are shorter than the passages of the peripheral portions of the collimator, the layer of target material deposited on the semiconductor wafer has improved thickness uniformity, as compared with PVD systems using collimators having uniform passage width and length dimensions.

As discussed in further detail above, PVD systems using collimators having cutouts with features discussed herein result in deposited layers of target material on the semiconductor wafer having improved thickness uniformity, as compared with PVD systems using traditional collimators.

One inventive aspect is a physical vapor deposition (PVD) system. The PVD system includes a pedestal configured to hold a semiconductor wafer, a cover plate configured to hold a target, and a collimator between the pedestal and the cover plate. The collimator includes a plurality of passages configured to pass source material travelling from the cover plate toward the pedestal at an angle less than a threshold angle with respect to a line perpendicular to a surface of the pedestal facing the cover plate, where the collimator is configured to block source material travelling from the cover plate toward the pedestal at an angle greater than the threshold angle, where a first passage of the plurality of passages has a first passage length, where a second passage of the plurality of passages has a second passage length, and where the first passage length is less than the second passage length.

In some embodiments, the second passage is in a more peripheral position of the collimator than the first passage.

In some embodiments, a ratio of the first passage length to the second passage length is less than about 0.9.

In some embodiments, at least a portion of the collimator has a cross sectional shape defined by a rectangle from which a trapezoid has been subtracted to form a cutout.

In some embodiments, at least a portion of the collimator has a cross sectional shape defined by a first rectangle from which a portion of a second rectangle having rounded corners has been subtracted to form a cutout, where the second rectangle is smaller than the first rectangle.

In some embodiments, at least a portion of the collimator has a cross sectional shape defined by a rectangle from which a portion of an ellipse has been subtracted to form a cutout.

In some embodiments, at least a portion of the collimator has a cross sectional shape defined by a rectangle from which a portion of a circle has been subtracted to form a cutout.

Another inventive aspect is a method of using a physical vapor deposition (PVD) system. The method includes holding a semiconductor wafer with a pedestal, holding a target with a cover plate, with a first plurality of passages of a collimator, passing source material travelling from the target toward the pedestal at an angle less than a first threshold angle with respect to a line perpendicular to a surface of the pedestal facing the cover plate, with a second plurality of passages of the collimator, passing source material travelling from the target toward the pedestal at an angle less than a second threshold angle with respect to the line, with a first plurality of sidewall sheets of the collimator, blocking source material travelling from the target toward the pedestal at an angle greater than the first threshold angle with respect to the line, and with a second plurality of sidewall sheets of the collimator, blocking source material travelling from the target toward the pedestal at an angle greater than the second threshold angle with respect to the line, where the first threshold angle is greater than the second threshold angle.

In some embodiments, the first plurality of passages is in a more central position of the collimator than the second plurality of passages.

In some embodiments, a ratio of a first length of the first plurality of passages to a second length of the second plurality of passages is less than about 0.9.

In some embodiments, the first plurality of sidewall sheets is in a more central position of the collimator than the second plurality of sidewall sheets.

In some embodiments, at least a portion of the collimator has a cross sectional shape defined by a first rectangle from which at least a portion of the first rectangle has been subtracted to form a cutout.

In some embodiments, the source material forms one or more conductive interconnect layers on the semiconductor wafer, where the conductive interconnect layers form electrical connections between circuit components including transistors, where the transistors include one or more of FinFET and gate all around (GAA) transistors, and where the transistors include barrier or capping features formed from one or more of Ti, TiN, Ta, TaN, Co, and AlO.

Another inventive aspect is a physical vapor deposition (PVD) system. The PVD system includes a pedestal configured to hold a semiconductor wafer, a cover plate configured to hold a target, and a collimator between the pedestal and the cover plate. The collimator is configured to pass source material travelling from the cover plate toward the pedestal at an angle less than a threshold angle with respect to a line perpendicular to a surface of the pedestal facing the cover plate, where the collimator is configured to block source material travelling from the cover plate toward the pedestal at an angle greater than the threshold angle, where at least a portion of the collimator has a cross sectional shape defined by a first rectangle from which at least a portion of the first rectangle has been subtracted to form a cutout.

In some embodiments, the cutout is in a more central position of the collimator and is not in a more peripheral position of the collimator.

In some embodiments, the collimator includes a plurality of sidewall sheets collectively forming a plurality of passages, where a first sidewall sheet of the plurality of sidewall sheets has a first sidewall sheet length, where a second sidewall sheet of the plurality of sidewall sheets has a second sidewall sheet length, and where the first sidewall sheet length is less than the second sidewall sheet length.

In some embodiments, the cross sectional shape of the portion of the collimator is defined by the first rectangle having a trapezoid subtracted therefrom to form the cutout.

In some embodiments, the cross sectional shape of the portion of the collimator is defined by the first rectangle having a second rectangle with rounded corners subtracted therefrom to form the cutout, where the second rectangle is smaller than the first rectangle.

In some embodiments, the cross sectional shape of the portion of the collimator is defined by the first rectangle having a portion of an ellipse subtracted therefrom to form the cutout.

In some embodiments, the cross sectional shape of the portion of the collimator is defined by the first rectangle having a portion of a circle subtracted therefrom to form the cutout.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A physical vapor deposition (PVD) system, comprising:
   a pedestal configured to accommodate a semiconductor wafer;
   a cover plate above the pedestal configured to hold a target; and
   a collimator disposed above the pedestal and below the cover plate, wherein:
   the collimator has an upper surface and a lower surface, the lower surface is flat, and the upper surface is non-flat, and
   the collimator has a plurality of sidewall sheets defining a first plurality of passages in a peripheral portion of the collimator to each have a same width dimension between adjacent ones of the plurality of sidewall sheets and a same first vertical dimension, and defining a second plurality of passages in a central portion of the collimator to each have the same width dimension between adjacent ones of the plurality of sidewall sheets and a respective second vertical dimension, each respective second vertical dimension being smaller than the same first vertical dimension.

2. The PVD system of claim 1, wherein the upper surface is facing the cover plate.

3. The PVD system of claim 1, wherein the lower surface is facing the pedestal.

4. The PVD system of claim 1, wherein the upper surface is characterized by a cutout in a cross-sectional view.

5. The PVD system of claim 4, wherein the cutout has a first height, in the vertical direction, at a central portion of the cutout larger than a second height, in the vertical direction, at a peripheral portion of the cutout.

6. The PVD system of claim 4, wherein the cutout is symmetric with respect to a central axis of the collimator.

7. The PVD system of claim 5, wherein the cutout is defined by a trapezoid.

8. The PVD system of claim 5, wherein the cutout is defined by a rectangle.

9. The PVD system of claim 8, wherein the rectangle has round corners.

10. The PVD system of claim 5, wherein the cutout is defined by a portion of an ellipse.

11. The PVD system of claim 5, wherein the cutout is defined by a portion of a circle.

12. The PVD system of claim 1, wherein the collimator comprises a plurality of passages configured to pass source material travelling from the cover plate toward the pedestal at an angle less than a threshold angle with respect to a line perpendicular to a surface of the pedestal facing the cover plate.

13. The PVD system of claim 12, wherein the collimator is configured to block source material travelling from the cover plate toward the pedestal at an angle greater than the threshold angle.

14. A physical vapor deposition (PVD) system, comprising:
a pedestal configured to hold a semiconductor wafer;
a cover plate configured to hold a target; and
a collimator disposed between the pedestal and the cover plate, wherein:
the collimator has an upper surface facing the cover plate and a lower surface facing the pedestal, wherein the lower surface is flat, and the upper surface is non-flat, and
the collimator has a plurality of sidewall sheets defining a first plurality of passages in a peripheral portion of the collimator to each have a same width dimension between adjacent ones of the plurality of sidewall sheets and a same first vertical dimension, and defining a second plurality of passages in a central portion of the collimator to each have the same width dimension between adjacent ones of the plurality of sidewall sheets and a respective second vertical dimension, each respective second vertical dimension being smaller than the same first vertical dimension.

15. The PVD system of claim 14, wherein the upper surface is characterized by a cutout in a cross-sectional view.

16. The PVD system of claim 15, wherein the cutout has a first height, in the vertical direction, at a central portion of the cutout larger than a second height, in the vertical direction, at a peripheral portion of the cutout.

17. The PVD system of claim 15, wherein a maximum width of the cutout is between 170 mm and 270 mm.

18. The PVD system of claim 15, wherein the cutout is defined by a trapezoid.

19. A method of using a physical vapor deposition (PVD) system, the method comprising:
holding a semiconductor wafer with a pedestal;
holding a target with a cover plate;
with a first plurality of passages of a collimator, passing source material travelling from the target toward the pedestal at an angle less than a first threshold angle with respect to a line perpendicular to a surface of the pedestal facing the cover plate;
with a second plurality of passages of the collimator, passing source material travelling from the target toward the pedestal at an angle less than a second threshold angle with respect to the line, wherein the first threshold angle is greater than the second threshold angle;
with a first plurality of sidewall sheets of the collimator, blocking source material travelling from the target toward the pedestal at an angle greater than the first threshold angle with respect to the line; and
with a second plurality of sidewall sheets of the collimator, blocking source material travelling from the target toward the pedestal at an angle greater than the second threshold angle with respect to the line; and
wherein the collimator has an upper surface and a lower surface, the lower surface is flat, and the upper surface is non-flat, and
wherein the collimator has a plurality of sidewall sheets defining a first plurality of passages in a peripheral portion of the collimator to each have a same width dimension between adjacent ones of the plurality of sidewall sheets and a same first vertical dimension, and defining a second plurality of passages in a central portion of the collimator to each have the same width dimension between adjacent ones of the plurality of sidewall sheets and a respective second vertical dimension, each respective second vertical dimension being smaller than the same first vertical dimension.

20. The method of claim 19, wherein the upper surface is characterized by a cutout in a cross-sectional view.

* * * * *